US011977129B2

United States Patent
(12) Dichler et al.

(10) Patent No.: US 11,977,129 B2
(45) Date of Patent: May 7, 2024

(54) ARC FAULT DETECTOR UTILIZING A BROADBAND SPECTRUM

(71) Applicant: Eaton Intelligent Power Limited, Dublin (IE)

(72) Inventors: Werner Dichler, Grossschoennau (AT); Guenter Martinek, Vienna (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 390 days.

(21) Appl. No.: 17/413,594

(22) PCT Filed: Sep. 9, 2019

(86) PCT No.: PCT/EP2019/073962
§ 371 (c)(1),
(2) Date: Jun. 14, 2021

(87) PCT Pub. No.: WO2020/126128
PCT Pub. Date: Jun. 25, 2020

(65) Prior Publication Data

US 2022/0043072 A1 Feb. 10, 2022

(30) Foreign Application Priority Data

Dec. 18, 2018 (GB) ..................................... 1820633

(51) Int. Cl.
*G01R 31/52* (2020.01)
*H02H 1/00* (2006.01)

(52) U.S. Cl.
CPC ........... *G01R 31/52* (2020.01); *H02H 1/0015* (2013.01)

(58) Field of Classification Search
CPC .... G01R 31/08; G01R 31/1227; G01R 31/40; G01R 31/50; G01R 31/52; H02H 1/0015;
(Continued)

(56) References Cited

U.S. PATENT DOCUMENTS 5,047,724 A * 9/1991 Boksiner ................ G01R 31/52 379/22.03
5,434,509 A * 7/1995 Blades ................... G01R 31/66 324/613
(Continued)

FOREIGN PATENT DOCUMENTS

CN 102687357 A 9/2012
CN 105143897 A 12/2015
(Continued)

*Primary Examiner* — Jared Fureman
*Assistant Examiner* — Nicolas Bellido
(74) *Attorney, Agent, or Firm* — LEYDIG, VOIT & MAYER, LTD.

(57) ABSTRACT

An arc fault detector includes: a first electric line; a sensor for monitoring an electric current or voltage spectrum in the first electric line and outputting a broadband measurement signal as a monitored signal; a minimum detection unit for detecting a minimum signal value of the monitored signal over a broadband measurement range as a detected minimum signal value; and a controller unit connected to an output of the minimum detection unit, the controller unit comparing the detected minimum signal value with a predefined arc pattern, and outputting a trigger signal on a trigger output if the detected minimum signal value matches the arc pattern.

14 Claims, 2 Drawing Sheets

(58) Field of Classification Search
CPC .......... H02H 1/0092; H02H 3/10; H02H 3/32; H02H 7/20
See application file for complete search history.

(56) References Cited

U.S. PATENT DOCUMENTS

| | | | | |
|---|---|---|---|---|
| 5,729,145 | A * | 3/1998 | Blades | G01R 31/1272 324/613 |
| 6,246,556 | B1 | 6/2001 | Haun et al. | |
| 8,089,737 | B2 * | 1/2012 | Parker | H02H 1/0015 361/42 |
| 8,218,274 | B2 | 7/2012 | Hastings et al. | |
| 10,830,808 | B2 | 11/2020 | Handy et al. | |
| 2010/0157486 | A1 | 6/2010 | Parker et al. | |
| 2011/0141644 | A1 * | 6/2011 | Hastings | H01L 31/02021 361/93.2 |
| 2017/0324236 | A1 | 11/2017 | Tomita et al. | |
| 2022/0181864 | A1 * | 6/2022 | Dichler | G01R 31/14 |

FOREIGN PATENT DOCUMENTS

| | | | |
|---|---|---|---|
| CN | 108700634 | A | 10/2018 |
| EP | 0824776 | B1 | 2/1998 |
| WO | WO-2021051401 | A1 * | 3/2021 |

* cited by examiner

ARC FAULT DETECTOR UTILIZING A BROADBAND SPECTRUM

CROSS-REFERENCE TO PRIOR APPLICATIONS

This application is a U.S. National Phase application under 35 U.S.C. § 371 of International Application No. PCT/EP2019/073962, filed on Sep. 9, 2019, and claims benefit to British Patent Application No. GB 1820633.4, filed on Dec. 18, 2018. The International Application was published in English on Jun. 25, 2020 as WO 2020/126128 under PCT Article 21(2).

FIELD

The present disclosure relates to an arc fault detector.

BACKGROUND

Known arc fault detectors detect an arc by analyzing an electric current or voltage. Those detectors analyze either the behavior of the circuit at fixed and constant frequencies or a wideband or broadband spectrum, usually by using a transformation method like Fast Fourier Transform (FFT).

Methods analyzing only fixed and constant frequencies are easy to implement with low technical demands regarding the electronic. As a consequence, detectors using such methods are also technically easy to implement, making them common for consumer arc fault protection switches. A drawback of such arc detectors is that they may not detect all arcs, and that they are prone to so called nuisance tripping.

Methods analyzing a wideband spectrum require more calculation power on the electronic side. Such methods demand powerful microcontrollers or computers and cannot be implemented at low costs within a circuit breaker. As a consequence of their technical complexity and higher costs such methods are not often used, although they are more efficient in detection an arc in an electric spectrum without nuisance tripping.

SUMMARY

In an embodiment, the present invention provides an arc fault detector, comprising: a first electric line; a sensor configured to monitor an electric current or voltage spectrum in the first electric line and to output a broadband measurement signal as a monitored signal; a minimum detection unit configured to detect a minimum signal value of the monitored signal over a broadband measurement range as a detected minimum signal value; and a controller unit connected to an output of the minimum detection unit, the controller unit being configured to compare the detected minimum signal value with a predefined arc pattern, and to output a trigger signal on a trigger output based on the detected minimum signal value matching the arc pattern.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention overcomes the drawbacks of the state of the art by providing an arc fault detector which can be implemented easily, which requires only simple technical components, and which has a high capability in detecting arcs, while retaining and a low tendency for nuisance tripping.

As a result, the arc fault detector of the invention can be implemented with simple technical components. This arc fault detector has a high capability in detecting arcs and a low tendency for nuisance tripping. The arc fault detector combines the advantages of the fixed frequency components, as it requires only simple electronics, and of the broadband spectrum analyzing methods, as it can also detect arcs in the case of additional high level noise signals when fixed input detectors would fail to detect an arc.

Figure 1:
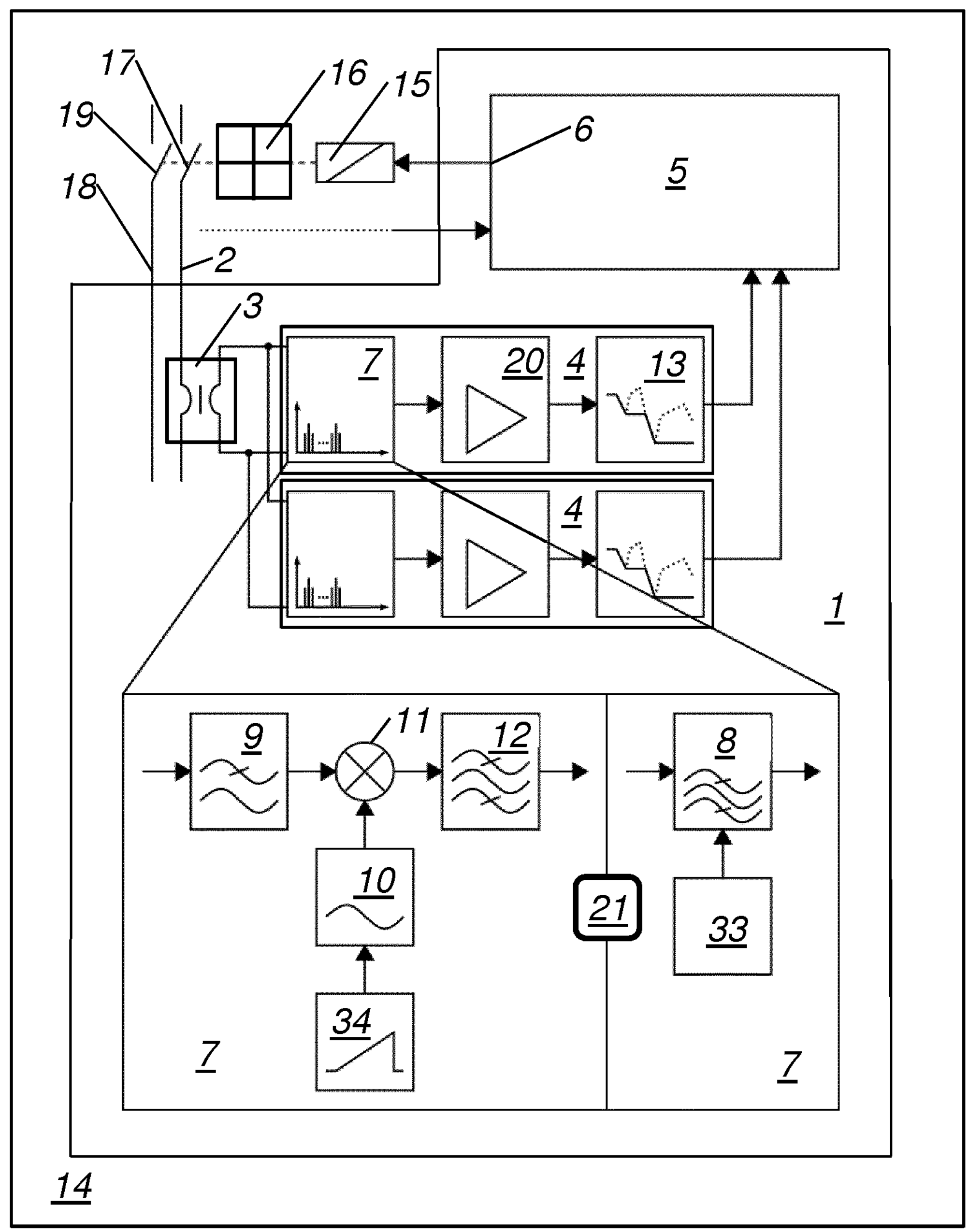
FIG. 1 shows a block diagram of a preferred embodiment of an arc fault detector as part of an arc fault circuit breaker.

FIG. 1 shows a block diagram of a preferred embodiment of an arc fault detector 1 with a first electric line 2 and one current or voltage sensor 3 adapted for monitoring an electric current respectively voltage spectrum in the first electric line 2 and outputting a broadband measurement signal. The arc fault detector 1 further comprises:

- a minimum detection unit 4 adapted to find a minimum signal value of the monitored signal over a broadband measurement range, and
- a controller unit 5 connected to an output of the minimum detection unit 4, the controller unit 5 being adapted to compare the detected minimum signal value with a predefined arc pattern, and to output a trigger signal on a trigger output 6 in case the minimum signal value matches the arc pattern in a predefined manner.

The described arc fault detector 1 can be implemented with simple technical components. The arc fault detector 1 has a high capability in detecting arcs, and a low tendency for nuisance tripping. The arc fault detector 1 combines the advantages of the fixed frequency components, as it requires only simple electronics, and the broadband spectrum analyzing methods, as it can also detect arcs in the case of additional high level noise signals, when fixed input detectors fail to detect an arc.

In the example described, the arc fault detector 1 contains a first electric line 2. Alternatively, the arc fault detector 1 contains also a second electric line 18 and can contain a number of further electric lines.

The arc fault detector 1 can be a stand-alone component, comprising a casing and clamps for connecting the electric lines 2, 18.

In the example described, the arc fault detector 1 is an integral part of an arc fault circuit breaker 14. The trigger output 6 of the arc fault detector 1 is connected to a trigger 15 and/or a switching mechanism 16 of the arc fault circuit breaker 14, and the switching mechanism 16 is connected to at least one pair of first switching contacts 17 arranged in the first electric line 2.

As indicated earlier, the arc fault detector 1 comprises the current or voltage sensor 3 which monitors the electric current in the first electric line 2 or the electric voltage between the first electric line 2 and a reference potential. Alternatively, the arc fault detector 1 comprises one current or voltage sensor 3 for each electric line 2, 18. In case of voltage measurement, the sensor 3 measures the voltage between the first electric line 2 and the second electric line 18.

The sensor 3 can be any type of current or voltage sensor 3 which has a high or broad bandwidth. That means that the sensor 3 shall not monitor an electric signal only at a single frequency but over broad spectrum of frequencies. The current or voltage sensor 3 outputs a broadband measurement signal.

In the context of this embodiment, broadband means that the current or voltage sensor 3 is adapted to output the broadband measurement signal with a bandwidth from at least 10 Hz to 10 MHz. The bandwidth can even be broader. In another example, the current or voltage sensor 3 is adapted to output the broadband measurement signal with a bandwidth from 1 Hz to 20 MHz.

The output of the sensor 3 is connected to the minimum detection unit 4 of the arc fault detector 1.

The minimum detection unit 4 is adapted to find an absolute minimum signal value within the broadband measurement signal. The output of the minimum detection unit 4 is connected to the controller unit 5 of the arc fault detector 1. The controller unit 5 is adapted to compare the detected minimum signal value with a predefined arc pattern. In case the minimum signal value matches the arc pattern the controller unit 5 outputs a trigger signal on a trigger output 6.

According to a first embodiment, the arc pattern includes tolerances so that it is not necessary for the detected minimum signal value to strictly match a predefined arc pattern.

According to a second embodiment, the controller unit 5 is embodied in such a way that a predefined likeness of the detected minimum signal value with a predefined arc pattern is sufficient for outputting the trigger signal.

The controller unit 5 is preferably implemented as a low-cost/low-speed controller.

The arc fault detector 1 can comprise more than one minimum detection unit 4.

The minimum detection unit 4 detects the absolute minimum value in the broadband measurement signal. In case of noise or an arc event, the broadband measurement signal contains a multitude of frequency components, each with a different value or amplitude. The minimum detection unit 4 detects the value of "smallest frequency component" or the value of the frequency component with the lowest amplitude.

The minimum detection unit 4 does not detect or determine a frequency of the minimum signal value or the frequency of any other frequency component. For this it is easy to implement as a frequency counter or any kind of spectrum analysis is not necessary.

The minimum detection unit 4 comprises two mayor components to find the minimum current value within the current measurement signal: a sweep unit 7 and a lowest value detector 13.

The sweep unit 7 is adapted to sweep a narrow bandwidth detection window over the broadband measurement range. Especially the narrow bandwidth detection window has a bandwidth of maximum ⅛, preferably ⅒ or even smaller, of the bandwidth of the measurement signal. According the preferred bandwidth of the measurement signal the narrow bandwidth detection window has a bandwidth of about 1 MHz.

The bandwidth of the detection window can further or alternatively be defined as ±10% of a middle frequency of the detection window.

FIG. 1 shows two preferred embodiments of the sweep unit 7. Under the block for the sweep unit 7 is a detail block diagram of two preferred embodiments. Reference sign 21 symbolizes a Boolean "or".

According to a first embodiment of the sweep unit 7, as shown in the right detail block diagram of the sweep unit 7, the sweep unit 7 comprises a tuneable band-pass filter 8. The tuneable band-pass filter 8 is connected to a separate generated tune signal 33.

According to a second embodiment of the sweep unit 7 as shown in the left detail block diagram of the sweep unit 7, the sweep unit 7 comprises a low-pass filter 9 as input of the sweep unit 7. The low pass filter 9 is connected to a mixer 11. The sweep unit 7 comprises further a tuneable oscillator 10. An input of the tuneable oscillator 10 is connected to a ramp generator 34. The output of the tuneable oscillator 10 is connected to the mixer 11. The mixer 11 mixes the low-pass filtered signal with the oscillator signal. The output of the mixer 11 is connected to an intermediate band-pass filter 12.

According the shown embodiment, the output of the sweep unit 7 is connected to an amplifier 20.

The output of the sweep unit 7 or the output of the amplifier 20 is connected to the lowest value detector 13. An output of the lowest value detector 13 is the output of the minimum detection unit 4, which is connected to the controller unit 5.

The lowest value detector 13 can be embodied with low cost analog components.

The behaviour of the arc detector 1 will be described with the help of the FIGS. 2 and 3.

Figure 2:
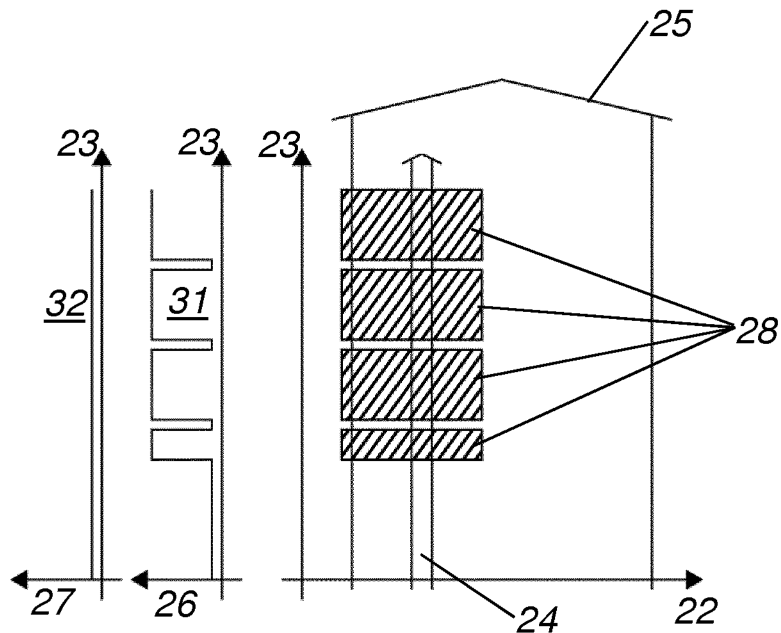
FIG. 2 shows three diagrams describing the different behavior of an arc fault detector according to the invention and of an arc fault detector with fixed frequency input according the state of the art in case of high amplitude noise caused by a load.

FIG. 2 shows three diagrams. The right diagram shows a spectrum with the frequency 22 on the abscissa and the time 23 on the ordinate. Reference sign 24 represents the fixed frequency input of the state of the art detector. Reference sign 25 represents the broadband measurement range which is evaluated by the arc fault detector 1. Reference sign 28 represents a high amplitude noise from a bad load. Such high amplitude noise caused by a load typically has a narrower bandwidth than a real arc event. The block pattern with the gaps along the time 23 are caused by the zero crossing of the line voltage. Tripping in the case of such high amplitude noise but in the absence of an arc would be considered a nuisance tripping.

The middle diagram in FIG. 2 illustrates the detection behaviour 26 of a state of the art arc fault detector with the fixed frequency input 24. As can be seen in the middle diagram of FIG. 2 the state of the art fixed frequency detector falsely detects an arc pattern when there is high amplitude noise. This is illustrated by the curve with reference sign 31 which represents the output of the state of the arc fault detector with fixed frequency input.

The left diagram in FIG. 2 illustrates the detection behaviour 27 of an arc fault detector 1. As can be seen in the left diagram of FIG. 2 the arc fault detector 1 will not detect an arc fault in the presence of the high amplitude noise. As only the minimum value is compared with the reference arc pattern, the high amplitude noise at low frequencies with lower bandwidth has no effect on the fault detection, because the value of the signal is lower at higher frequency components. And only the absolute minimum value is compared with the arc pattern. This is illustrated by the curve with reference sign 32 means, that no arc is detected and a circuit breaker 14 with such a detector 1 would not trip in this case.

In the example according to FIG. 2 the state of the art fixed frequency input arc fault detector would detect an arc fault without a real arc fault. The arc fault detector 1 would not detect any arc and would not cause nuisance detection or tripping.

Figure 3:
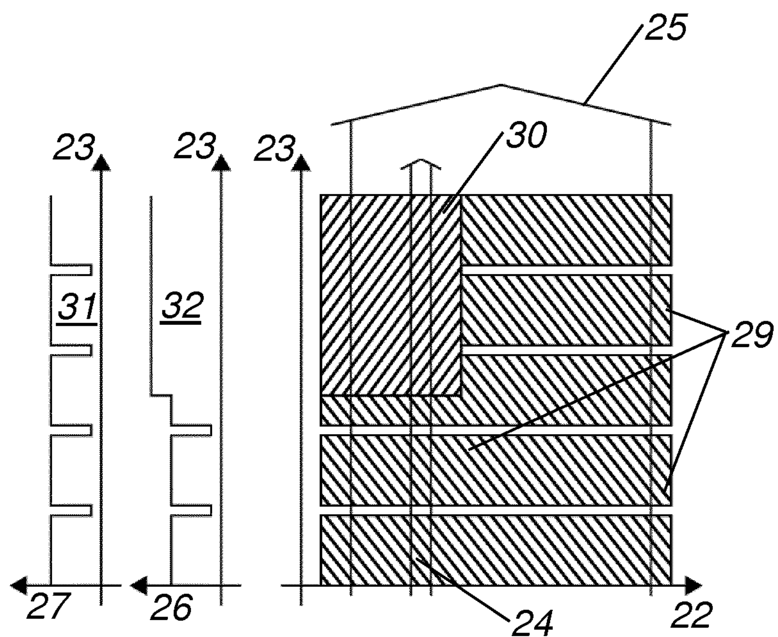
FIG. 3 shows three diagrams describing the different behavior of an arc fault detector according to the invention and an arc fault detector with fixed frequency input according the state of the art in case of an arc fault together with a high level noise signal.

FIG. 3 shows also three diagrams. The abscissas and ordinates are named like in the diagrams according FIG. 2. Reference sign 29 represents an arc pattern which should be detected by an arc fault detector. Reference sign 30 represents an additional high level noise signal. Pay attention that the high level noise signal 30 does not break down during zero crossing.

As can be seen in the middle diagram of FIG. 3 the state of the art fixed frequency detector detects an arc pattern when in presence of the arc pattern 29, but fails to detect the arc pattern 29 when it is overlapping with the high level noise signal 30. This is illustrated in the curve with reference 32.

As can be seen in the left diagram of FIG. 3 the arc fault detector 1 will successfully detect an arc fault in all those situations. As only the minimum values are compared with the arc pattern and a broader spectrum is analysed, the high level noise signal 30 does not mask the arc pattern 29.

In the example according to FIG. 3 the state of the art fixed frequency input arc fault detector would not detect an arc fault. The arc fault detector 1 would detect an arc and would cause detection or tripping.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article “a” or “the” in introducing an element should not be interpreted as being exclusive of a plurality of elements. Likewise, the recitation of “or” should be interpreted as being inclusive, such that the recitation of “A or B” is not exclusive of “A and B,” unless it is clear from the context or the foregoing description that only one of A and B is intended. Further, the recitation of “at least one of A, B and C” should be interpreted as one or more of a group of elements consisting of A, B and C, and should not be interpreted as requiring at least one of each of the listed elements A, B and C, regardless of whether A, B and C are related as categories or otherwise. Moreover, the recitation of “A, B and/or C” or “at least one of A, B or C” should be interpreted as including any singular entity from the listed elements, e.g., A, any subset from the listed elements, e.g., A and B, or the entire list of elements A, B and C.

The invention claimed is:

1. An arc fault detector, comprising:

a first electric line;

a sensor configured to monitor an electric current or voltage spectrum in the first electric line and to output a broadband measurement signal as a monitored signal;

a minimum detection unit configured to detect a minimum signal value of the monitored signal over a broadband measurement range as a detected minimum signal value, wherein the minimum signal value is an amplitude of a frequency component of the broadband measurement signal having the lowest amplitude; and a controller unit connected to an output of the minimum detection unit, the controller unit being configured to compare the detected minimum signal value with a predefined arc pattern, and to output a trigger signal on a trigger output based on the detected minimum signal value matching the arc pattern, wherein the minimum detection unit comprises a sweep unit, and wherein the sweep unit is configured to sweep a narrow bandwidth detection window over the broadband measurement range.

2. The arc fault detector of claim 1, wherein the sensor is configured to output the broadband measurement signal with a bandwidth from at least 10 Hz to 10 MHz.

3. The arc fault detector of claim 1, wherein the minimum detection unit is configured to detect the minimum signal value without determination of a frequency of the minimum signal value.

4. The arc fault detector of claim 1, wherein the narrow bandwidth detection window has a bandwidth of maximum ⅛ of a bandwidth of the measurement signal.

5. The arc fault detector of claim 1, wherein the sweep unit comprises a tuneable band-pass filter.

6. The arc fault detector of claim 1, wherein the sweep unit comprises a low-pass filter as an input of the sweep unit.

7. The arc fault detector of claim 6, wherein the sweep unit further comprises:

a ramp generator;

a tuneable oscillator comprising an input connected to the ramp generator and an output connected to a mixer; and the mixer comprising an output connected to an intermediate band-pass filter, wherein the mixer mixes a low-pass filtered signal with a tuneable oscillator signal.

8. The arc fault detector of claim 1, wherein the minimum detection unit comprises a lowest value detector, the lowest value detector being connected to an output of the sweep unit, and an output of the lowest value detector being an output of the minimum detection unit.

9. An arc fault circuit breaker, comprising:

at least one arc fault detector of claim 1, wherein the trigger output is connected to a trigger and/or a switching mechanism of the arc fault circuit breaker, and wherein the switching mechanism is connected to at least one pair of first switching contacts arranged in the first electric line.

10. The arc fault detector of claim 1, wherein controller unit is configured to output the trigger signal on the trigger output further based on the detected minimum signal value matching the arc pattern within a tolerance of the arc pattern.

11. The arc fault detector of claim 1, wherein controller unit is configured to output the trigger signal on the trigger output further based on a predefined likeness of the detected minimum signal value matching the arc pattern.

12. The arc fault detector of claim 1, wherein the minimum detection unit further comprises a lowest value detector and an amplifier, and wherein the sweep unit is connected to an input of the amplifier.

13. The arc fault detector of claim 12, wherein the lowest value detector comprises analog components, and an output of the lowest value detector is the output of the minimum detection unit.

14. The arc fault detector of claim 1, wherein the narrow bandwidth detection window comprises frequencies within 10% of a middle frequency of the broadband measurement range.

* * * * *